United States Patent
Kim et al.

[11] Patent Number: 6,087,226
[45] Date of Patent: Jul. 11, 2000

[54] METHODS OF FORMING CAPACITORS INCLUDING ELECTRODES WITH HEMISPHERICAL GRAINED SILICON LAYERS ON SIDEWALLS THEREOF AND RELATED STRUCTURES

[75] Inventors: Young-sun Kim, Kyungki-do; Se-jin Shim, Seoul; Cha-young Yoo; Young-wook Park, both of Kyungki-do, all of Rep. of Korea

[73] Assignee: Samsung Electronics Co., Ltd., Rep. of Korea

[21] Appl. No.: 09/048,501

[22] Filed: Mar. 26, 1998

[51] Int. Cl.$^7$ .................................. H01L 21/8234
[52] U.S. Cl. .................. 438/275; 438/239; 438/253; 438/255; 438/398
[58] Field of Search ..................... 438/238, 239, 438/253, 254, 255, 396, 397, 398, 275

[56] References Cited

U.S. PATENT DOCUMENTS

| | | | |
|---|---|---|---|
| 5,234,862 | 8/1993 | Aketagawa et al. | 437/103 |
| 5,329,482 | 7/1994 | Nakajima et al. | 365/182 |
| 5,366,917 | 11/1994 | Watanabe et al. | 437/47 |
| 5,372,962 | 12/1994 | Hirota et al. | 437/47 |
| 5,385,863 | 1/1995 | Tatsumi et al. | 437/109 |
| 5,394,012 | 2/1995 | Kimura | 257/739 |
| 5,405,801 | 4/1995 | Han et al. | 436/60 |
| 5,447,878 | 9/1995 | Park et al. | 438/396 |
| 5,464,791 | 11/1995 | Hirota | 436/60 |
| 5,486,488 | 1/1996 | Kamiyama | 436/60 |
| 5,543,347 | 8/1996 | Kawano et al. | 437/60 |
| 5,554,557 | 9/1996 | Koh | 437/52 |
| 5,567,637 | 10/1996 | Hirota | 437/43 |
| 5,590,051 | 12/1996 | Yokozawa | 364/496 |
| 5,595,937 | 1/1997 | Mikagi | 437/192 |
| 5,616,511 | 4/1997 | Hirota | 438/396 |
| 5,623,243 | 4/1997 | Watanabe et al. | 257/309 |
| 5,633,187 | 5/1997 | Hsu | 438/275 |
| 5,798,280 | 8/1998 | Mathews et al. | 438/565 |
| 6,004,858 | 12/1999 | Shim et al. | 438/398 |

FOREIGN PATENT DOCUMENTS 4-286151  10/1992  Japan .

OTHER PUBLICATIONS

H. Watanabe et al., *Hemispherical Grained Silicon (HSG–Si) Formation on In–Situ Phosphorous Doped Amorphous–Si Using The Seeding Method*, Extended Abstracts of the 1992 International Conference on Solid State Devices and Materials, Tsububa, 1992, pp. 422–424.

H. Watanabe et al., *An Advanced Fabrication Technology of Hemispherical Grained (HSG) Poly–Si for High Capacitance Storage Electrodes*, Extended Abstracts of the 1991 International Conference on Solid State Devices and Materials, Yokohama, 1991, pp. 478–480.

H. Watanabe et al., *A New Cylindrical Capacitor Using Hemispherical Grained Si (HSG–Si) for 256Mb DRAMs*, IEEE 1992, IEDM, 10.1.1–10.1.4, pp. 259–262.

*Primary Examiner*—Matthew Smith
*Assistant Examiner*—Rodner M. Jerome
*Attorney, Agent, or Firm*—Myers Bigel Sibley & Sajovec

[57] ABSTRACT

A method of forming an integrated circuit device includes forming a conductive layer on an integrated circuit substrate, and forming a buffer layer on the conductive layer opposite the integrated circuit substrate. The buffer layer and the conductive layer are patterned to provide a mesa structure including the patterned buffer and conductive layers. A conductive spacer is formed along a sidewall of the mesa structure, and a hemispherical grained silicon layer is formed on the conductive spacer opposite the sidewall of the mesa structure. The patterned buffer layer is then removed after the step of forming the hemispherical grained silicon layer. Related structures are also discussed.

11 Claims, 2 Drawing Sheets

6,087,226

METHODS OF FORMING CAPACITORS INCLUDING ELECTRODES WITH HEMISPHERICAL GRAINED SILICON LAYERS ON SIDEWALLS THEREOF AND RELATED STRUCTURES

FIELD OF THE INVENTION

The present invention relates to the field of integrated circuits and more particularly to methods of forming capacitors for integrated circuit devices and related structures.

BACKGROUND OF THE INVENTION

As dynamic random access memory (DRAM) devices become more highly integrated, the area available for each memory cell is reduced. Accordingly, the substrate area available for each memory cell capacitor may be reduced so that it may be difficult to maintain a desired memory cell capacitance as integration densities increase. Reduced memory cell capacitances may lower the reading capacity of the memory cell, increase a soft error rate (SER), and/or degrade the memory cell operation at low voltages. Accordingly, there exists a need to provide a memory cell capacitor occupying a reduced surface area of the memory device substrate while maintaining a desired capacitance.

In response, capacitors having three-dimensional structures have been proposed to increase the surface area of the capacitor electrodes thereby increasing the capacitance of the resulting capacitor. In particular, a cylindrical electrode structure has been discussed wherein the inner and outer surfaces of a cylinder are used to increase the effective capacitor electrode area.

Capacitor electrode surface areas have also been increased using hemispherical grained silicon (HSG-Si) layers on the surface of a capacitor electrode. The hemispherical grained silicon layer increases the surface area of the capacitor electrode by providing a roughened surface thus increasing the memory cell capacitance. It may be difficult, however, to form a hemispherical grained silicon layer on the surface of the cylindrical capacitor electrode as discussed below.

First, it may be difficult to provide a desired conductivity for the hemispherical grained silicon layer if the thickness of the hemispherical grained silicon layer is too great. In particular, the hemispherical grained silicon layer may be formed in an undoped state. Accordingly, the hemispherical grained silicon layer is preferably doped with a dopant such as phosphorous to provide the conductive capacitor electrode. In particular, the hemispherical grained silicon layer can be deposited and then dopants can be diffused from the cylindrical polysilicon electrode to the hemispherical grained silicon layer thereon. The capacitance of the resulting capacitor may thus be closely related to the doping concentration of the hemispherical grained silicon layer. In other words, the memory cell capacitance may increase with increased doping concentrations of the hemispherical grained silicon layer.

In the case of the cylindrical capacitor electrode, however, the hemispherical grained silicon layer may be formed on the inner and outer surfaces of the electrode. Accordingly, the hemispherical grained silicon layer may be insufficiently doped if the hemispherical grained silicon layer is too thick. There may thus be practical limits to the thickness of a hemispherical grained silicon layer to maintain a desired conductivity.

Second, the use of a hemispherical grained silicon layer on a cylindrical capacitor electrode may result in damage to the cylindrical capacitor electrode. In particular, a conductive bridge may be formed between neighboring capacitor electrodes when forming the hemispherical grained silicon layer. Accordingly, any bridging between capacitor electrodes should be removed to prevent electrical shorts between the respective memory cells. These bridges are commonly removed using an etch-back step. This etch-back step, however, may damage the cylindrical storage electrodes thereby reducing an effective surface area thereof.

Accordingly, there continues to exist a need in the art for improved methods of forming memory cell capacitors.

SUMMARY OF THE INVENTION

It is therefore an object of the present invention to provide improved methods of forming capacitor electrodes for integrated circuit devices and related structures.

It is another object of the present invention to provide methods of forming capacitors having increased capacitance and related structures.

These and other objects are provided according to the present invention by methods including the steps of forming a conductive layer on an integrated circuit substrate, and forming a buffer layer on the conductive layer opposite the integrated circuit substrate. The buffer layer and the conductive layer are patterned to provide a mesa structure including the patterned buffer and conductive layers. A conductive spacer is formed along a sidewall of the mesa structure, and a hemispherical grained silicon layer is formed on the conductive spacer opposite the sidewall of the mesa structure. The patterned buffer layer is then removed after the step of forming the hemispherical grained silicon layer. Accordingly, the hemispherical grained silicon layer is formed on the outer wall of the conductive spacer, and the inner wall of the conductive spacer is free of the hemispherical grained silicon layer. The thickness of the hemispherical grained silicon layer can thus be increased while maintaining adequate doping thereof.

In addition, the step of forming the hemispherical grained silicon layer may include forming the hemispherical grained silicon layer on the conductive spacer opposite the sidewall of the mesa structure and on the substrate adjacent the conductive spacer, and the step of removing the patterned buffer layer can be preceded by removing portions of the hemispherical grained silicon layer on the substrate adjacent the conductive layer. The removal of the hemispherical grained silicon layer from the substrate reduces the possibility of electrical shorts between adjacent capacitor electrode structures. By maintaining the buffer layer during the step of removing the hemispherical grained silicon layer, damage to the conductive spacer can be reduced. The step of removing portions of the hemispherical grained silicon layer on the substrate can include performing an etch-back step.

The hemispherical grained silicon layer can have a thickness in the range of 300 Angstroms to 800 Angstroms, and the buffer layer can include a material such as silicon oxide, silicon nitride, or combinations thereof. The capacitor electrode thus formed can be used to provide the storage electrode for a memory cell capacitor of a dynamic random access memory device. Accordingly, the step of forming the conductive layer can be preceded by the step of forming an insulating layer on the substrate wherein the insulating layer has a contact hole therethrough exposing a portion of the substrate. The patterned conductive layer can be electrically coupled with the substrate through the contact hole. Moreover, the step of forming the insulating layer can be preceded by forming a memory cell transistor on the substrate wherein a source/drain region of the memory cell transistor is electrically coupled with the patterned conductive layer through the contact hole.

The conductive layer can be a polysilicon layer doped with a material such as phosphorous, arsenic, or tin. In addition, the method can include the steps of forming a dielectric layer on the conductive spacer and on the patterned conductive layer, and forming a second conductive layer on the dielectric layer opposite the conductive spacer and opposite the patterned conductive layer.

According to an alternate aspect of the present invention, an integrated circuit device can include a capacitor electrode on an integrated circuit substrate. This capacitor electrode includes a conductive layer on the substrate and a conductive spacer surrounding the conductive layer wherein the conductive layer extends a greater distance from the substrate than the conductive layer extends. Moreover, the conductive spacer has an inner wall adjacent the conductive layer and an outer wall opposite the conductive layer. In addition, a hemispherical grained silicon layer is provided on the outer wall of the conductive spacer and the inner wall of the conductive spacer is free of the hemispherical grained silicon layer.

The methods and structures of the present invention can thus be used to provide memory cell capacitors which occupy a smaller area of an integrated circuit substrate while maintaining a predetermined capacitance. These capacitor structures can thus be used to provide improved performance in highly integrated circuit memory devices.

DETAILED DESCRIPTION

Figure 1:
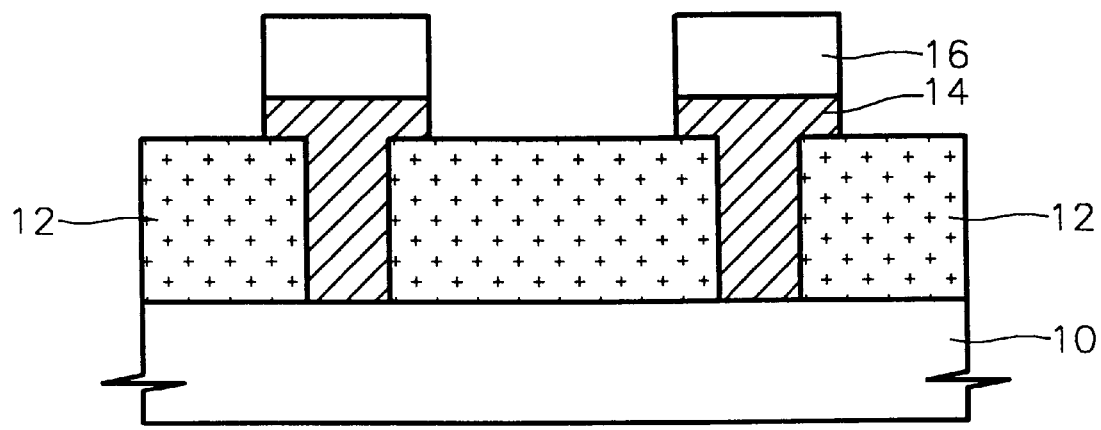
FIGS. 1 through 4 are cross-sectional views illustrating steps of a method of forming a capacitor electrode according to the present invention.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout. It will also be understood that when a layer is referred to as being "on" another layer or substrate, it can be directly on the other layer or substrate, or intervening layers may also be present.

When forming a dynamic random access memory (DRAM) device, a memory cell access transistor such as a field effect transistor is formed on the substrate 10. A planarization layer 12 can then be formed on the semiconductor substrate 10 and the memory cell access transistor to reduce a step difference caused by the transistor. The planarization layer 12 is then selectively etched to form a contact hole therethrough exposing a source/drain region of the memory cell access transistor. A conductive layer and an insulating layer are then deposited on the planarization layer 12 and patterned to provide the conductive layer 14 and a buffer layer 16 shown in FIG. 1. Moreover, a plurality of respective memory cell access transistors, contact holes, conductive layers, and buffer layers can be formed.

As shown in FIG. 1, the conductive layer 14 extends through the contact hole and the planarization layer 12 to provide electrical coupling with the source/drain region of the memory cell access transistor on the substrate 10. Moreover, the patterned conductive and buffer layers 14 and 16 provide a mesa structure on the planarization layer 12 surrounded by exposed portions of the planarization layer 12. A plurality of these mesa structures can thus be formed wherein the conductive layer 14 of each mesa structure is electrically coupled with a source/drain region of a respective memory cell access transistor of a respective memory cell.

As shown, the conductive layer 14 can fill the contact hole. The conductive layer 14 can be formed from polysilicon doped with an N-type dopant such as phosphorous (P), arsenic (As), or tin (Sn). The buffer layer 16 is preferably formed of a material having an etch rate lower than that of the conductive layer 14. For example, if the conductive layer 14 is formed from polysilicon, the buffer layer 16 may be formed from silicon oxide, silicon nitride, or stacked layers of silicon oxide and silicon nitride.

Figure 2:
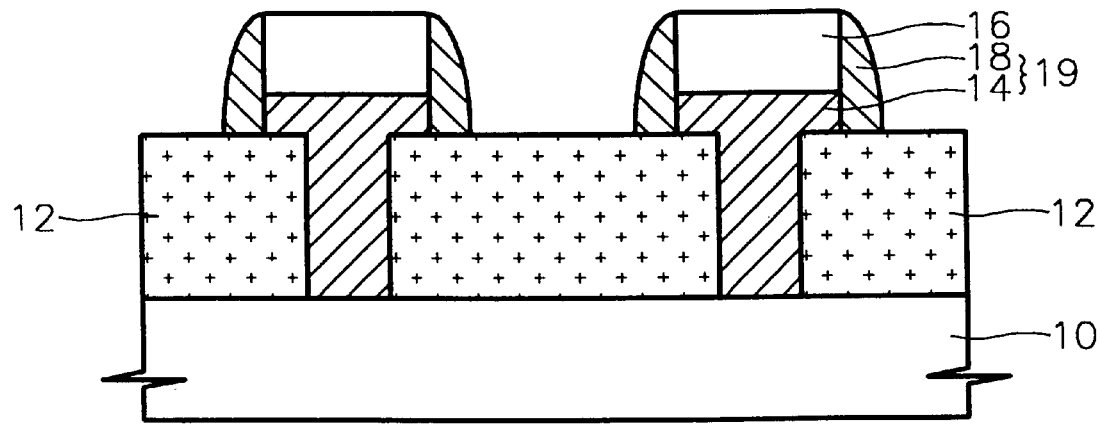

A conductive spacer 18 is then formed along sidewalls of the mesa structure defined by the conductive layer 14 and the buffer layer 16 as shown in FIG. 2. In particular, a layer of a conductive material is deposited on the exposed surfaces of the buffer layer 16, the exposed sidewalls of the conductive layer 14, and the exposed surfaces of the planarization layer 12 adjacent the mesa structure. This layer of conductive material is then etched-back to form the spacers 18 along the sidewalls of the buffer layer 16 and the conductive layer 14. The spacer 18 thus provides the sidewalls of the cylindrical capacitor electrode. In other words, the cylindrical capacitor electrode 19 is defined by the conductive layer 14 and the conductive spacer 18. The conductive spacer 18 is preferably formed of the same material used to form the conductive layer 14. In particular, both the conductive spacer 18 and the conductive layer 14 can be formed of doped polysilicon.

Figure 3:
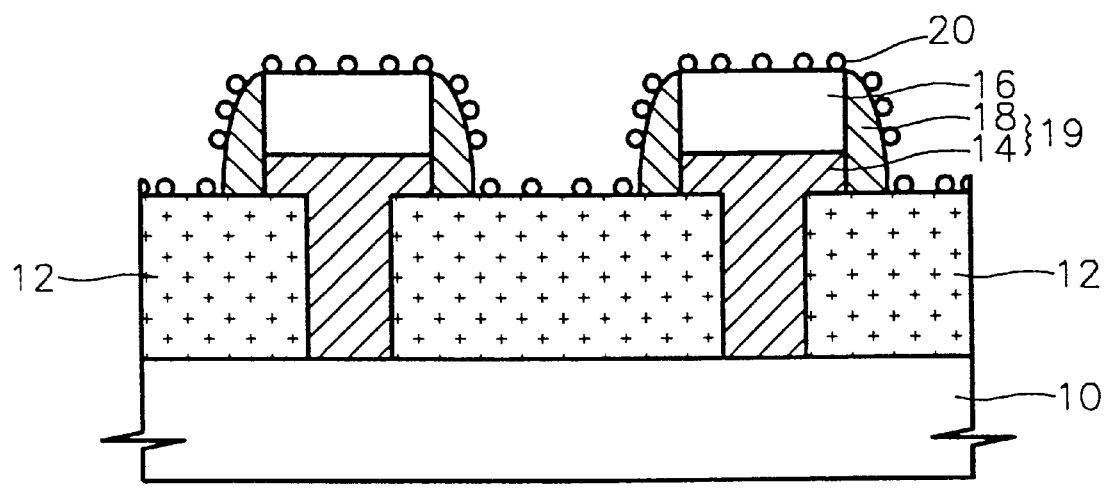

A hemispherical grained silicon layer 20 is then formed on the exposed surfaces of the buffer layer 16, the conductive spacers 18, and the planarization layer 12 as shown in FIG. 3. The hemispherical grained silicon layer 20 can be formed using techniques known to those having skill in the art. The formation of a hemispherical grained silicon layer on a cylindrical capacitor electrode is discussed, for example, in the reference by Watanabe et al. entitled "A New Cylindrical Capacitor Using Hemispherical Grained Silicon (HSG-Si) for 256Mb DRAMs." IEDM 92-259, pp. 10.1.1–10.1.4, (1992) IEEE. The disclosure of this reference is hereby incorporated herein in its entirety by reference. The hemispherical grained silicon layer 20 can be formed in a chemical vapor deposition chamber using silane ($SiH_4$) gas or disilane ($Si_2H_6$) gas. The thickness of the hemispherical grained silicon layer 20 is preferably in the range of 300 Angstroms to 800 Angstroms.

As shown in FIG. 3, the inner walls of the conductive spacer 18 are formed against the sidewalls of the buffer layer 16 so that the inner walls of the conductive spacer 18 are not exposed during the step of forming the hemispherical grained silicon layer 20. Accordingly, the hemispherical grained silicon layer 20 is formed on the outer wall of the conductive spacer 18 but not on the inner wall of the conductive spacer 18. The hemispherical grained silicon layer 20 may also be formed on the exposed surface of the buffer layer 16 and on the exposed surface of the planarization layer 12 between neighboring capacitor electrodes 19.

Figure 4:
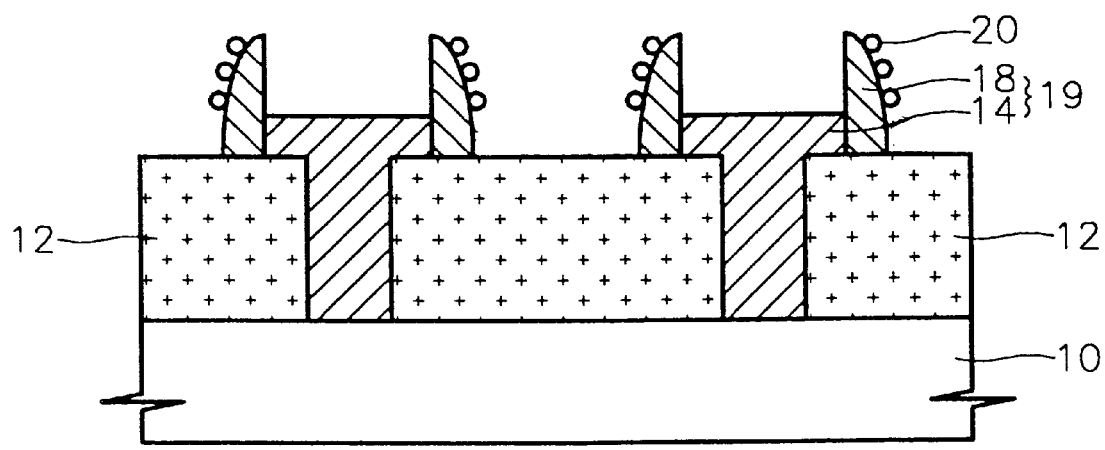

The buffer layer 16 and the portions of the hemispherical grained silicon layer 20 on the planarization layer 12 are then removed as shown in FIG. 4. In particular, an etch-back step can be performed so that the portions of the hemispherical grained silicon layer 20 on the planarization layer 12 between the capacitor electrodes 19 is removed. The possibility of conductive bridges between the capacitor electrodes is thus reduced. The buffer layer 16 can then be removed using a technique such as a wet etch. Accordingly, only the outer walls of the conductive spacers 18 are exposed during the etch-back step used to remove the hemispherical grained silicon layer from the planarization layer 12 so that damage to the conductive spacer is reduced. As shown, only the portions of the hemispherical grained silicon layer 20 formed on the outer wall of the conductive spacer 18 remain.

Because the hemispherical grained silicon layer is formed before removing the buffer layer 16, the hemispherical grained silicon layer is formed only on the outer wall of the cylindrical capacitor electrode 19, and the inner wall of the cylindrical capacitor electrode 19 is free of the hemispherical grained silicon layer. The thickness of the hemispherical grained silicon layer can thus be increased and still be adequately doped through diffusion from the conductive spacer 18. In other words, a thicker hemispherical grained silicon layer can be provided with a desired conductivity so that a surface area of the capacitor electrode can be increased without reducing a conductivity of the hemispherical grained silicon layer thereon. The buffer layer also protects the inner wall of the conductive spacer 18 during the step of removing portions of the hemispherical grained silicon layer from the planarization layer 12. Damage to the cylindrical capacitor electrode can thus be reduced.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an integrated circuit device, said method comprising the steps of:

forming a conductive layer on an integrated circuit substrate;

forming a buffer layer on said conductive layer opposite said integrated circuit substrate;

patterning said buffer layer and said conductive layer to provide a mesa structure including said patterned buffer and conductive layers;

forming a conductive spacer along a sidewall of said mesa structure; and forming a hemispherical grained silicon layer on said conductive spacer opposite said sidewall of said mesa structure while maintaining said patterned buffer layer on said patterned conductive layer.

2. A method of forming an integrated circuit device, said method comprising the steps of:

forming a conductive layer on an integrated circuit substrate;

forming a buffer layer on said conductive layer opposite said integrated circuit substrate;

patterning said buffer layer and said conductive layer to provide a mesa structure including said patterned buffer and conductive layers;

forming a conductive spacer along a sidewall of said mesa structure;

forming a hemispherical grained silicon layer on said conductive spacer opposite said sidewall of said mesa structure; and removing said patterned buffer layer after said step of forming said hemispherical grained silicon layer.

3. A method according to claim 2 wherein said step of forming said hemispherical grained silicon layer comprises forming said hemispherical grained silicon layer on said conductive spacer opposite said sidewall of said mesa structure and on said substrate adjacent said conductive spacer, and wherein said step of removing said patterned buffer layer is preceded by the step of:

removing portions of said hemispherical grained silicon layer on said substrate adjacent said conductive spacer.

4. A method according to claim 3 wherein said step of removing portions of said hemispherical grained silicon layer on said substrate comprises performing an etch-back step.

5. A method according to claim 1 wherein said hemispherical grained silicon layer has a thickness in the range of 300 Ångstroms to 800 Ångstroms.

6. A method according to claim 1 wherein said buffer layer comprises a material selected from the group consisting of silicon oxide, silicon nitride, and combinations thereof.

7. A method according to claim 1 wherein said step of forming said conductive layer is preceded by the step of:

forming an insulating layer on said substrate wherein said insulating layer has a contact hole therethrough exposing a portion of said substrate wherein said patterned conductive layer is electrically coupled with said substrate through said contact hole.

8. A method according to claim 7 wherein said step of forming said insulating layer is preceded by the step of:

forming a memory cell transistor on said substrate wherein a source/drain region of said memory cell transistor is electrically coupled with said patterned conductive layer through said contact hole.

9. A method according to claim 1 wherein said conductive layer comprises a doped polysilicon layer.

10. A method according to claim 9 wherein said doped polysilicon layer is doped with a material selected from the group consisting of phosphorus (P), arsenic (As), and tin (Sn).

11. A method according to claim 2 further comprising the steps of:

forming a dielectric layer on said conductive spacer and on said patterned conductive layer; and forming a second conductive layer on said dielectric layer opposite said conductive spacer and opposite said patterned conductive layer.

* * * * *